United States Patent [19]
Zangrando et al.

[11] 4,083,016
[45] Apr. 4, 1978

[54] COUPLED-CAVITY MICROWAVE OSCILLATOR

[75] Inventors: Donald Roy Zangrando, Los Altos, Calif.; Clifford Herrol Kelley, Jr., San Jose, Calif.

[73] Assignee: Varian Associates, Inc., Palo Alto, Calif.

[21] Appl. No.: 754,867

[22] Filed: Dec. 27, 1976

[51] Int. Cl.² .................... H03B 7/14; H03B 9/12
[52] U.S. Cl. .................................... 331/56; 331/96; 331/107 R; 331/107 G
[58] Field of Search ........... 331/96, 97, 107 R, 107 G, 331/107 T, 117 D, 46, 56, 101, 102

[56] References Cited
U.S. PATENT DOCUMENTS 3,568,110  3/1971  Ivanek ..................... 331/96 X
3,810,045  5/1974  Ruttan ..................... 331/96

*Primary Examiner*—Siegfried H. Grimm
*Attorney, Agent, or Firm*—Stanley Z. Cole; Richard B. Nelson; Robert K. Stoddard

[57] ABSTRACT

An oscillator for very high microwave or millimeter-wave frequencies employs a pair of negative-resistance semiconductive devices, each mounted in its own resonant cavity. The two cavities are coupled together by an iris in their common wall. An output waveguide is coupled symmetrically to both sides of the common wall to load both cavities equally. An adjustable mode-control element projects into the cavity to the near vicinity of one of the devices to induce the oscillator to start in the desired mode. Additional dielectric or metallic tuners in the cavities provide a wide variation of frequency.

18 Claims, 10 Drawing Figures

COUPLED-CAVITY MICROWAVE OSCILLATOR

FIELD OF THE INVENTION

The invention pertains to very high frequency oscillators, particularly at millimeter wave frequencies, using negative-resistance semiconductive devices as their driving elements. At these frequencies, the amount of power available from any one active device is very limited, so it is desirable to combine the power capabilities of several active devices.

PRIOR ART

Previous attempts to increase the power output of semiconductor oscillators have involved methods of coupling two or more semiconductive devices into a single resonant cavity in order to synchronize their oscillations. U.S. Pat. No. 3,810,045 issued May 7, 1974 to Thomas G. Ruttan, and assigned to the assignee of the present invention describes a push-pull oscillator using two Gunn devices in a single waveguide-type cavity approximately one full wavelength long. The Gunn devices were positioned near the opposite ends of the cavity, so that when a full-wavelength mode was excited, the fields at the devices were 180° out of phase, in other words, the devices were in push-pull operation. While Ruttan's oscillator did combine the outputs of the two devices, there were problems with oscillation in some of the many modes that could exist in this extended cavity in addition to the desired single-wavelength mode.

Other attempts to obtain push-pull operation involved a conductive septum in the H-plane of the cavity connecting to back-to-back negative-resistance diodes. U.S. Pat. No. 3,617,935 issued Nov. 2, 1971 to Katuhiro Kimura et al. describes such oscillators. However, the additional structural complexity caused by the presence of the septum also introduced the possibility of new unwanted modes.

U.S. Pat. No. 3,562,665 issued Feb. 9, 1971 to R. D. Larrabee describes an oscillator in which an insulated septum divides the resonant cavity into two mutually insulated half-cavities coupled by irises in the septum. This structure can eliminate some of the modes associated with a rf-floating septum but has the problem that rf bypassing all of the cavity circulating current is quite difficult and a bypass choke of this size has its own undesired resonant modes.

SUMMARY OF THE INVENTION

The principal objective of the present invention is to provide a high-frequency oscillator in which the outputs of a plurality of negative-resistance semiconductive devices can be combined to produce increased power.

Another objective is to provide a means of combining the outputs of a plurality of devices in which oscillation is restricted to the desired mode.

A further objective is to provide a multi-device oscillator which is easily tunable over an extended frequency range.

These objectives are realized by dividing the resonant circuit of the oscillator into two adjacent, closely coupled cavities. An equal number of negative-resistance devices is coupled into each cavity, preferably by locating the devices and their coupling means within the cavities themselves. Coupling between the two cavities is provided by an iris in their common wall, and coupling to the useful load is preferably provided by an output located adjacent the common wall to couple equally from both cavities.

DESCRIPTION OF THE PREFERRED EMBODIMENTS

Figures 1, 2, 3:
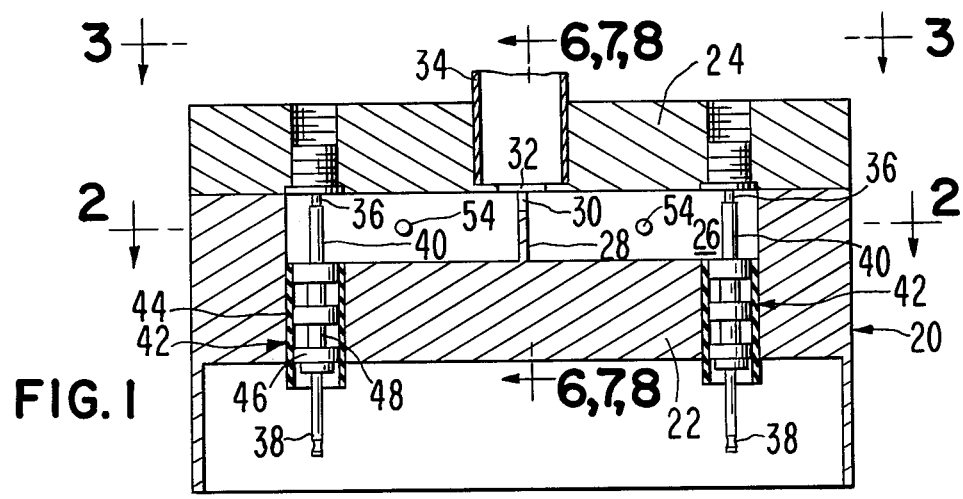
FIG. 1 shows a cross-section of an oscillator according to the invention, taken through the parallel axes of the active devices.
FIG. 2 is a plan view cross-section of the oscillator of FIG. 1 taken through plane 2—2.
FIG. 3 is a top view taken in the same direction as FIG. 2.

FIGS. 1, 2 and 3 are respectively a side section, a horizontal section, and a top view of an embodiment of the present invention. The resonant cavity structure 20 is made as a hollowed-out, one-piece metal block 22 covered by a generally flat metallic lid 24. Two resonant cavities 26 are cut into block 22 leaving a thin, common dividing wall 28 separating them. In wall 28 a coupling iris 30 is cut to mutually couple the electromagnetic fields of cavities 26. An iris 32 in cover plate 24 is located symmetrically centered above common wall 28, coupling fields from both cavities 26 into a rectangular output waveguide 34 extending out vertically through cover-plate 24. In each cavity 26, preferably near an outer wall thereof, is a semiconductive negative-resistance device 36, such as a Gunn diode. The upper terminals of diodes 36 are conductively connected to the cover-plate 24 of cavity structure 20. The lower terminals of diodes 36 are conductively connected to bias terminals 38 for supplying dc bias to diodes 36. The connection comprises a post 40 extending across the height of cavity 26 to couple diodes 36 with the electromagnetic fields of cavities 26. The bias connection exits through the wall of cavity block 22 via an rf choke 42 comprising an insulating, thin sleeve 44 lining a hole in block 22. In series with lead 38 are sections of low-impedance coaxial line 46 extending radially to contact insulator 44, alternating with high impedance sections 48 having smaller diameter center conductors.

It has been found that for the oscillator to start in its proper cavity mode, it is useful to have a mode-suppressor rod 50 in close proximity to device-coupling rod 40. Suppressor 50 may be of high dielectric constant, such as sapphire, or alternatively may be of an rf lossy material such as a dielectric loaded with carbon. Rod 50 enters cavity 26 on the midplane and is mounted on a screw 52 such that its separation from coupling rod 40 is adjustable. A mode supprssor 50 may be incorporated near each active device 36 as shown, or alternatively in some cases a single suppressor 50 may be adequate.

Also projecting into cavity 26 is a tuning rod 54, also located on the midplane of cavity 26. A tuning rod 54 may be used in each cavity 26 as shown, or alternatively a single rod 54 in one cavity 26 may produce adequate tuning. Tuning rod 54 is mounted on a screw 56 to adjust its penetration into cavity 26 to tune the frequency of the oscillator. Tuner 54 may be dielectric, such as sapphire; in which case it is located to penetrate a region of cavity 26 where the rf electric field is high to achieve maximum tuning. Alternatively, tuner 54 may be a metallic rod; in this case the tuner is preferably located in a region of cavity 26 where the rf magnetic field is high, whereby tuner 54 acts as an inductive tuner to raise the cavity frequency by displacing magnetic field. In operation a dc bias current is supplied to each active device 36 through its bias lead 38 from a bias current supply (not shown). If the devices 36 are not perfectly similar, it may be preferable to have a separate, adjustable bias supply for each device. Oscillation is set up in cavities 26 in a push-pull mode with magnetic field pattern as shown by dotted lines 58. In this mode, each of cavities 26 contributes equally to the coupling of power out into waveguide 34 through load coupling iris 32. Cavity coupling iris 30 synchronizes the oscillations in the two cavities 26.

Figure 4:
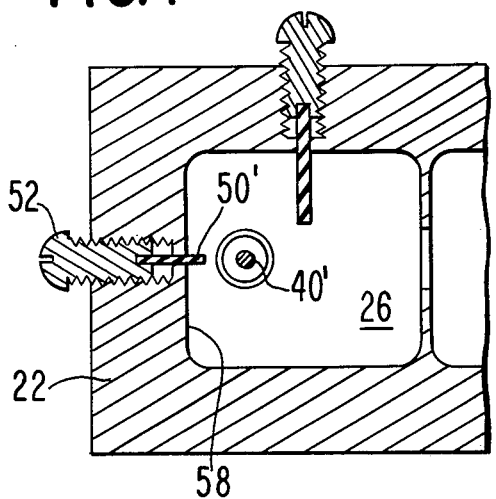
FIG. 4 is a partial sectional plan view showing an alternative arrangment of mode-control and tuning elements.

FIG. 4 shows a modification of the mode suppressor. Here mode suppressor rod 50' enters through the end 58 of cavity 26 which is close to coupling rod 40.

Figure 5:
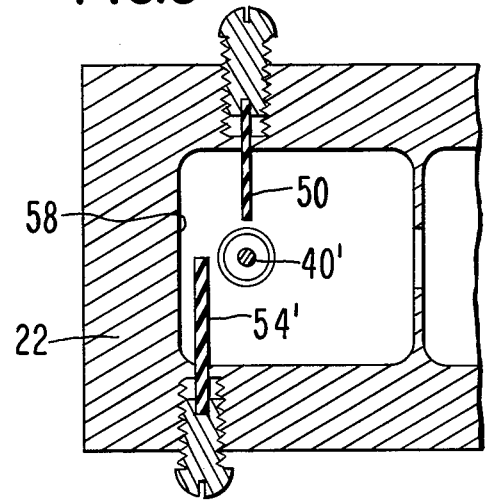
FIG. 5. is a view similar to FIG. 4 illustrating still another embodiment of control and tuning elements.

FIG. 5 illustrates a somewhat different embodiment in which coupling rod 40' is located at a sufficient distance from end wall 58 such that tuner rod 54' may be located between coupling rod 40' and end wall 58. In this case, as mentioned above, tuner 54' is in a region of high rf magnetic field and may be a metallic, inductive-tuning rod. Another embodiment is to move coupling rode 40' towards iris/coupling wall 28 such that tuner 54 is dielectric and located between coupling rod 40 and outside wall 58.

Figure 6:
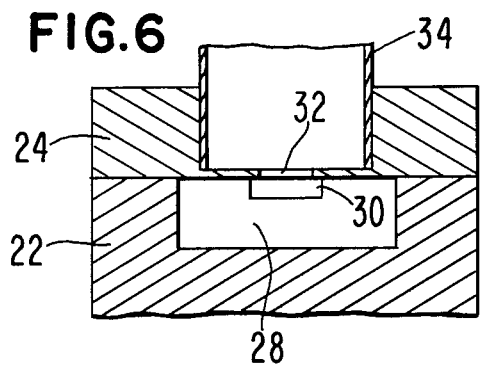
FIG. 6. is a vertical section of the oscillator of FIG. 1 taken through plane 6—6.
Figure 7:
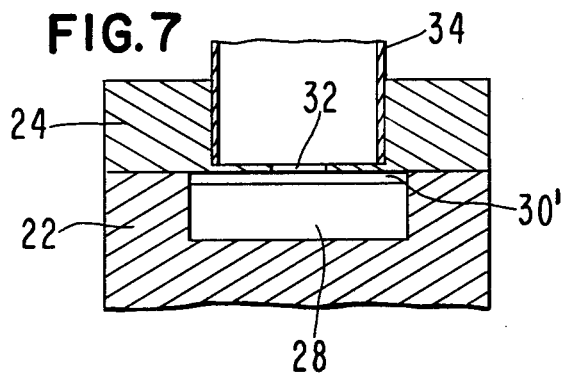
FIG. 7 is a view similar to FIG. 6 showing an alternative coupling iris.
Figure 8:
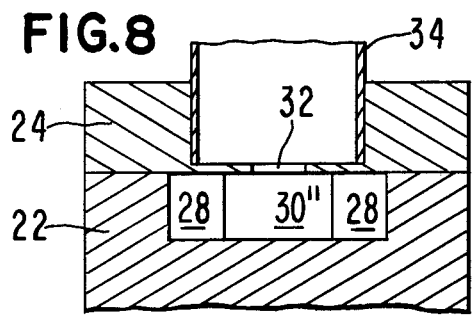
FIG. 8 is another section similar to FIG. 6 showing still another coupling iris.

FIGS. 6, 7 and 8 illustrate alternative embodiments of couplng iris 30. FIG. 6 is an end section of the oscillator of FIGS. 1, 2 and 3 in which iris 30 is a shallow cut-out in common wall 28 located directly below output coupling iris 32. FIG. 7 shows an alternative capacitive iris 30' extending entirely across the width of cavities 26. The capacitive iris produces a different frequency relationship of the various cavity modes and may be desirable for some applications. FIG. 8 illustrates a full-height inductive iris 30" which produces stronger coupling between cavities 26 than the partial-height iris 30.

Figure 9:
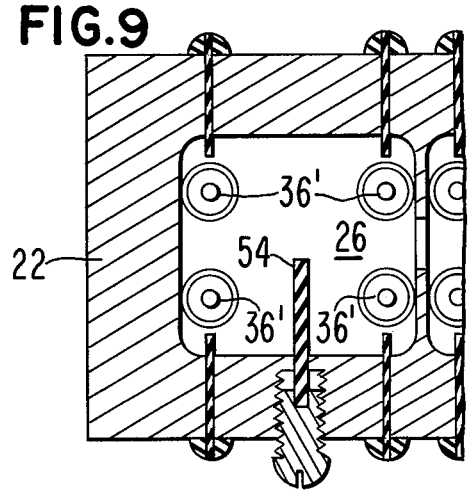
FIG. 9 is a partial section similar to FIG. 4 illustrating four active devices in each cavity.

FIG. 9 illustrates a different embodiment in which four active devices 36' are located in each cavity 26 to further increase the generated power. The electromagnetic fields associated with all the devices in a single cavity 26 are synchronous. It is to be understood that the number of devices in each cavity may be chosen to suit the application. To maintain the balanced push-pull operation, it is necessary that the number of devices in each cavity 26 be equal.

Figure 10:
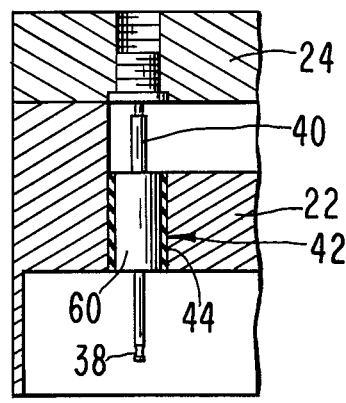
FIG. 10 is a partial section similar to FIG. 1 showing an alternative rf bypass.

FIG. 10 illustrates an alternative embodiment of the rf bypass 42'. Here the coupling rod 40 is connected to the bias supply terminal 38 through a simple coaxial bypass capacitor formed by a metallic cylinder 60 passing through a hole in cavity block 22 and insulated therefrom by a thin walled dielectric cylinder 44. The isolation of the bypass of FIG. 10 may not be quite as good as the choke structure illustrated in FIG. 1 but it is mechanically simple and rugged.

The embodiments described above are intended to be illustrative and not limiting. Many other embodiments will be obvious to those skilled in the art. The invention is intended to be limited only by the following claims and their legal equivalents.

We claim:

1. An oscillator comprising:
   a conductive cavity resonator structure comprising two resonant hollow cavities electromagnetically coupled together by a coupling iris in a common wall separating said cavities,
   two equal sets of negative-resistance semiconductive devices, each of said sets being coupled to the electromagnetic field in a separate one of said cavities,
   each of said devices having a first and second terminal for connection to a source of dc bias, means for applying dc bias to said devices comprising conductive lead means insulated from said cavity resonator structure connecting to said first terminal of each device, and
   means for coupling electromagnetic energy from said cavities into a useful load, said means for coupling comprising an output iris overlaying said coupling iris, said output iris coupling into an output waveguide.

2. The oscillator of claim 1 wherein each of said sets is a single device.

3. The oscillator of claim 1 wherein said cavities are symmetric about a midplane of said common wall.

4. The oscillator of claim 3 wherein said means for coupling is symmetric about said midplane.

5. The oscillator of claim 1 further comprising a mode control element protruding from a wall of one of said cavities into the vicinity of said one of said devices.

6. The oscillator of claim 5 wherein said mode control element is dielectric.

7. The oscillator of claim 5 wherein said mode control element is a material having high radio-frequency loss.

8. The oscillator of claim 5 wherein the spacing between said control element and said device is adjustable.

9. The oscillator of claim 1 further including a movable tuning element protruding from a wall of one of said cavities into a region of high electromagnetic field.

10. The oscillator of claim 9 wherein said tuning element is dielectric and said electromagnetic field is rf electric field.

11. The oscillator of claim 9 wherein said tuning element is conductive and said electromagnetic field is rf magnetic field.

12. The oscillator of claim 1 wherein said second terminals are connected to said resonator structure.

13. The oscillator of claim 1 wherein said conductive lead means comprises mutually insulated leads connecting to each of said first terminals.

14. The oscillator of claim 1 further comprising isolation means for preventing radio-frequency energy from leaving said cavity structure via said lead means.

15. The oscillator of claim 14 wherein said isolation means comprises a low-pass filter.

16. The oscillator of claim 15 wherein said low-pass filter is a bypass capacitor.

17. The oscillator of claim 15 wherein said low-pass filter is a choke comprising at least one shunt capacitive element and at least one series inductive element.

18. The oscillator of claim 15 wherein said low-pass filter comprises series sections of transmission line of alternating low and high characteristic impedance.

* * * * *